(12) United States Patent
Minemura et al.

(10) Patent No.: US 9,286,978 B2
(45) Date of Patent: Mar. 15, 2016

(54) NONVOLATILE SEMICONDUCTOR MEMORY DEVICE

(71) Applicant: Kabushiki Kaisha Toshiba, Minato-ku (JP)

(72) Inventors: Yoichi Minemura, Yokkaichi (JP); Takayuki Tsukamoto, Yokkaichi (JP); Takamasa Okawa, Yokkaichi (JP); Hiroshi Kanno, Yokkaichi (JP); Atsushi Yoshida, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 79 days.

(21) Appl. No.: 14/208,242

(22) Filed: Mar. 13, 2014

(65) Prior Publication Data

US 2015/0098265 A1    Apr. 9, 2015

Related U.S. Application Data

(60) Provisional application No. 61/888,889, filed on Oct. 9, 2013.

(51) Int. Cl.
| | |
|---|---|
| *G11C 11/00* | (2006.01) |
| *G11C 13/00* | (2006.01) |
| *G11C 11/56* | (2006.01) |

(52) U.S. Cl.
CPC ........ *G11C 13/0069* (2013.01); *G11C 11/5685* (2013.01); *G11C 13/0064* (2013.01); *G11C 13/0007* (2013.01); *G11C 2213/71* (2013.01); *G11C 2213/72* (2013.01)

(58) Field of Classification Search
USPC .................................................. 365/148, 163
See application file for complete search history.

(56) References Cited

U.S. PATENT DOCUMENTS

| | | | | |
|---|---|---|---|---|
| 5,815,436 | A | 9/1998 | Tanaka et al. | |
| 7,800,935 | B2 * | 9/2010 | Maejima et al. | 365/148 |
| 8,300,444 | B2 | 10/2012 | Nagashima et al. | |
| 8,315,082 | B2 * | 11/2012 | Toda | 365/148 |
| 8,379,432 | B2 * | 2/2013 | Maejima et al. | 365/148 |
| 8,787,070 | B2 * | 7/2014 | Shimakawa | 365/148 |
| 8,942,025 | B2 * | 1/2015 | Katayama et al. | 365/148 |
| 2012/0250400 | A1 | 10/2012 | Katayama | |

FOREIGN PATENT DOCUMENTS

| | | |
|---|---|---|
| JP | 9-139092 | 5/1997 |
| JP | 2009-99199 | 5/2009 |
| JP | 2009-99206 | 5/2009 |
| JP | 2012-209004 | 10/2012 |

\* cited by examiner

*Primary Examiner* — Trong Phan
(74) *Attorney, Agent, or Firm* — Oblon, McClelland, Maier & Neustadt, L.L.P.

(57) ABSTRACT

A nonvolatile semiconductor memory device according to an embodiment includes a control circuit configured to cause data to be stored in a memory cell by setting the memory cell to be included in one of resistance value distributions. The control circuit is configured to set a first resistance value distribution and a second resistance value distribution, the second resistance value distribution having a resistance value larger than that of the first resistance value distribution, and to set a second width to be larger than a first width, the second width being a width between a second upper limit value of the second resistance value distribution and a second lower limit value of the second resistance value distribution, and the first width being a width between a first upper limit value of the first resistance value distribution and a first lower limit value of the first resistance value distribution.

17 Claims, 8 Drawing Sheets

NONVOLATILE SEMICONDUCTOR MEMORY DEVICE

CROSS REFERENCE TO RELATED APPLICATION

This application is based upon and claims the benefit of priority from Provisional Application No. 61/888,889, filed on Oct. 9, 2013, the entire contents of which are incorporated herein by reference.

BACKGROUND

1. Field

Embodiments described in the present specification relate to a nonvolatile semiconductor memory device.

2. Description of the Related Art

In recent years, as semiconductor memory devices have become more highly integrated, memory cells configuring these semiconductor memory devices have become increasingly miniaturized. In recent years, a memory cell including a resistance varying memory attracts attention.

When such a resistance varying memory is used storing multi-level data in a memory cell, it is expected to improve reliability of data stored in the memory cell.

DETAILED DESCRIPTION

A nonvolatile semiconductor memory device according to an embodiment comprises: a memory cell array including memory cells arranged therein, the memory cell being disposed between a first line and a second line and including a variable resistance element; and a control circuit configured to cause data of 2 bits or more to be stored in the memory cell by setting the memory cell to be included in one of resistance value distributions, and to apply a voltage to the memory cell in a write operation. The control circuit is configured to set a first resistance value distribution and a second resistance value distribution, the second resistance value distribution having a resistance value larger than that of the first resistance value distribution, and to set a second width to be larger than a first width, the second width being a width between a second upper limit value as an upper limit value of the second resistance value distribution and a second lower limit value as a lower limit value of the second resistance value distribution, and the first width being a width between a first upper limit value as an upper limit value of the first resistance value distribution and a first lower limit value as a lower limit value of the first resistance value distribution.

Next, embodiments of the present invention will be described in detail with reference to the drawings.

[First Embodiment]

Figure 1:
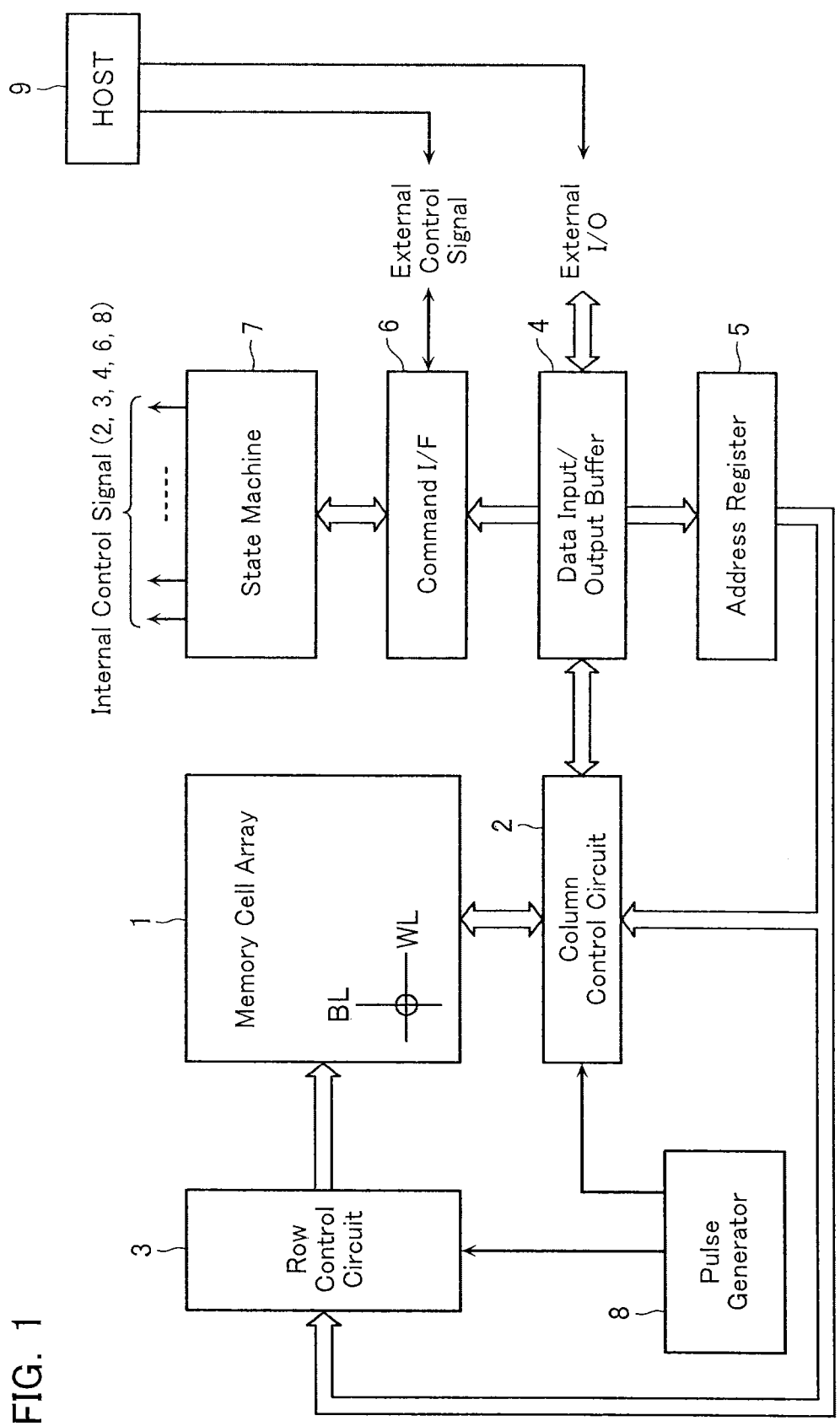
FIG. 1 is an example of a block diagram of a nonvolatile semiconductor memory device according to an embodiment of the present invention.

FIG. 1 is a block diagram of a nonvolatile memory according to a first embodiment of the present invention.

This nonvolatile memory comprises a memory cell array 1 having memory cells disposed in a matrix therein, each memory cell using a variable resistance element which will be described later.

Provided at a position adjacent to the memory cell array 1 in a bit line BL direction is a column control circuit 2 that controls a bit line BL of the memory cell array 1 and applies a voltage required in data erase of the memory cell, data write to the memory cell, and data read from the memory cell.

Moreover, provided at a position adjacent to the memory cell array 1 in a word line WL direction is a row control circuit 3 that controls a word line WL of the memory cell array 1 and applies a voltage required in data erase of the memory cell, data write to the memory cell, and data read from the memory cell.

A data input/output buffer 4 is connected to an external host 9, via an I/O line, to receive write data, receive an erase command, output read data, and receive address data or command data.

The data input/output buffer 4 sends write data received from the external host 9 to the column control circuit 2, and receives data read from the column control circuit 2 to be outputted to external. An address supplied to the data input/output buffer 4 from external is sent to the column control circuit 2 and the row control circuit 3 via an address register 5.

Moreover, a command supplied to the data input/output buffer 4 from the host 9 is sent to a command interface 6. The command interface 6 receives an external control signal from the host 9 to determine whether data inputted to the data input/output buffer 4 is write data or a command or an address, and, if a command, receive the data and transfer the data to a state machine 7 as a command signal.

The state machine 7 performs management of this nonvolatile memory overall via internal control signal (2, 3, 4, 6, 8), and receives a command from the host 9, via the command interface 6, to perform management of read, write, erase, input/output of data, and so on. In addition, it is also possible for status information managed by the state machine 7 to be received by the external host 9, thereby enabling an operation result to be judged by the external host 9. Moreover, this status information is utilized also in control of write and erase. Furthermore, the state machine 7 controls a pulse generator 8. This control enables the pulse generator 8 to output a pulse of any voltage and any timing.

Now, the pulse formed by the pulse generator 8 can be transferred to any line selected by the column control circuit 2 and the row control circuit 3. Note that elements of peripheral circuits other than the memory cell array 1 can be formed in a Si substrate directly below the memory cell array 1 formed in a wiring layer, whereby chip area of this nonvolatile memory can be made substantially equal to area of the memory cell array 1.

Figure 2:
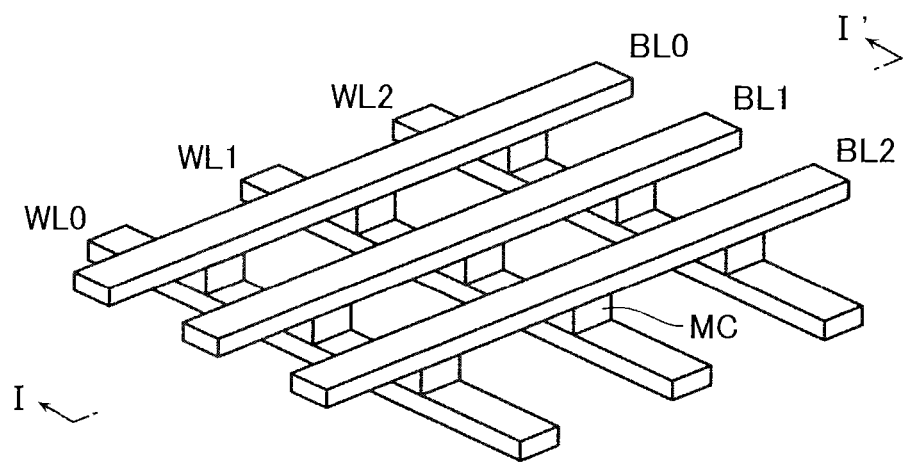
FIG. 2 is an example of a perspective view of part of a memory cell array 1.
Figure 3:
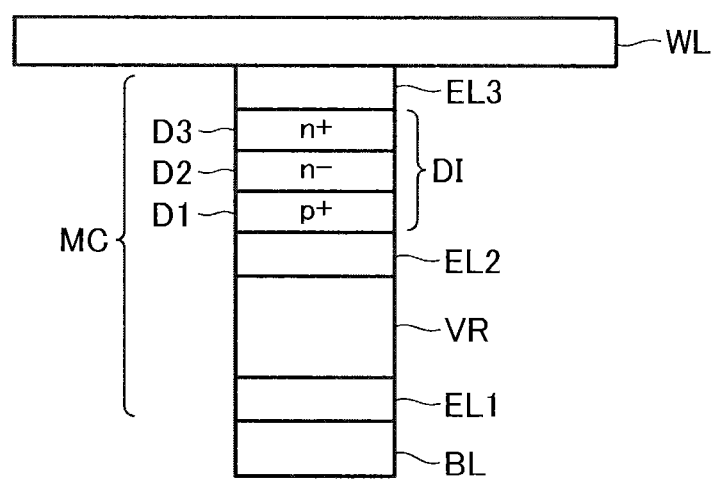
FIG. 3 is an example of a cross-sectional view of a single memory cell portion taken along the line I-I' looking in the direction of the arrows in FIG. 2.

FIG. 2 is a perspective view of part of the memory cell array 1, and FIG. 3 is a cross-sectional view of a single memory cell portion taken along the line I-I' and looking in the direction of the arrows in FIG. 2. Word lines WL0 to WL2 acting as a plurality of first lines are arranged in parallel, bit lines BL0 to BL2 acting as a plurality of second lines are arranged in parallel intersecting these word lines WL0 to WL2, and a memory cell MC is disposed at each of intersections of these word lines and bit lines to be sandwiched between both lines. The first and second lines are desirably of a material that is heat resistant and has a low resistance value. For example, the likes of W, WSi, NiSi, and CoSi may be employed as the material.

As shown in FIG. 3, the memory cell MC is configured from a series-connected circuit of a variable resistance element VR and a diode DI. As an example, as shown in FIG. 3, the diode DI is configured from a PIN diode comprising a p+ type layer D1, an n− type layer D2, and an n+ type layer D3. Here, the symbols "+" and "−" indicate magnitude of impurity concentration. Moreover, the following may also be employed as the diode DI, namely various kinds of diodes such as a PN junction diode, a Schottky diode, or the like, an MIM (Metal-Insulator-Metal) structure, an SIS (Silicon-Insulator-Silicon) structure, and so on.

The variable resistance element VR is configured from, for example, a thin film of an oxide of a transition metal (for example, hafnium oxide ($HfO_x$)). Oxides of the following other transition metals besides hafnium may also be employed as the variable resistance element VR, namely chromium (Cr), tungsten (W), vanadium (V), niobium (Nb), tantalum (Ta), titanium (Ti), zirconium (Zr), scandium (Sc), yttrium (Y), thorium (Th), cobalt (Co), nickel (Ni), copper (Cu), zinc (Zn), cadmium (Cd), aluminum (Al), gallium (Ga), tin (Sn), lead (Pb), antimony (Sb), and bismuth (Bi). Moreover, oxides of rare earth elements from lanthanum (La) to lutetium (Lu) may also be employed.

Disposed respectively on a lower and an upper surface of this variable resistance element VR are a first electrode EL1 and a second electrode EL2. The first electrode EL1 and the second electrode EL2 function as an adhesive layer to the variable resistance element and as a barrier metal.

Additionally, formed between the diode DI and the word line WL is an electrode EL3 that functions as a barrier metal and an adhesive layer. As shown in FIG. 3, the memory cell MC is configured from the series-connected circuit of the variable resistance element VR and the diode DI.

Employable as an electrode material of the electrodes EL1, EL2, and EL3 are the likes of Pt, Au, Ag, TiAlN, SrRuO, Ru, RuN, Ir, Co, Ti, TiN, TaN, LaNiO, Al, $PtIrO_x$, $PtRhO_x$, Rh, TaAlN, W, and so on. A metal film so as to render orientation uniform may also be inserted in addition to the electrodes EL1, EL2, and EL3.

Figure 4:
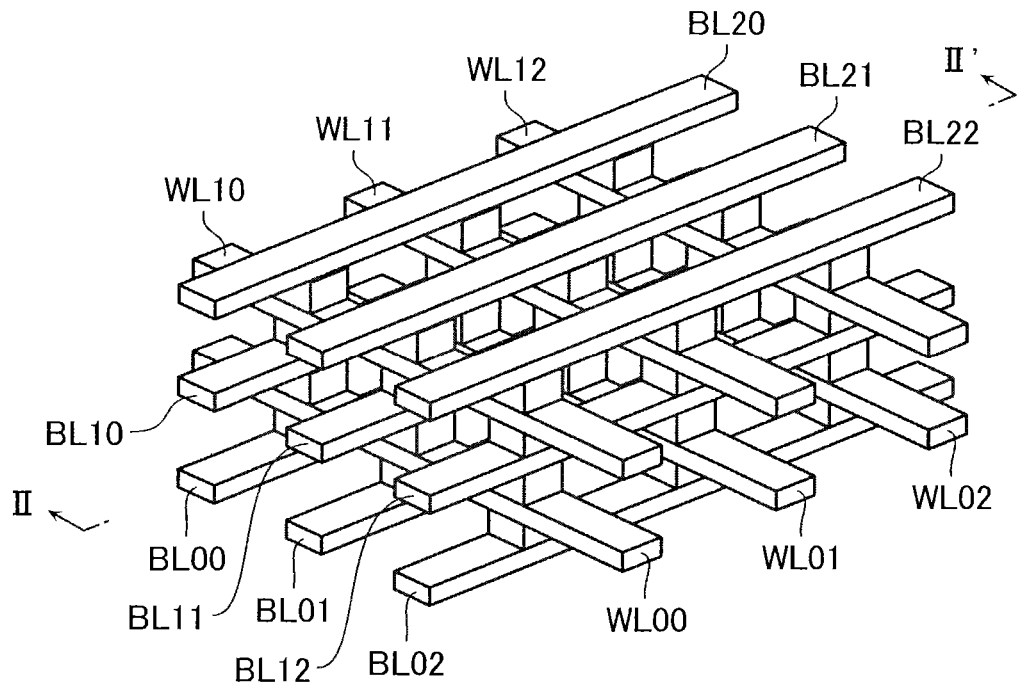
FIG. 4 is an example of a perspective view showing another example of configuration of the memory cell array 1.
Figure 5:
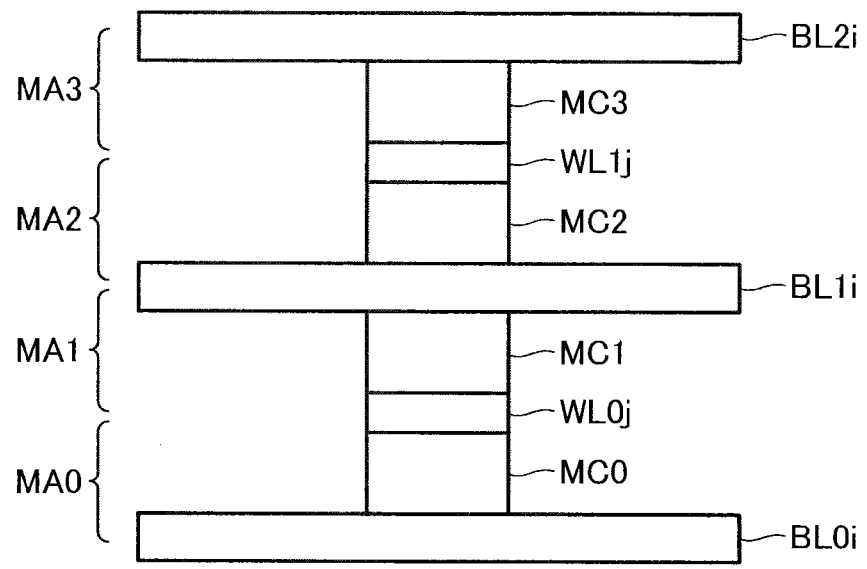
FIG. 5 is an example of a cross-sectional view showing the other example of configuration of the memory cell array 1.

In addition, as shown in FIG. 4, it is also possible to adopt a three-dimensional structure having the above-described memory structure multiply stacked. FIG. 5 is a cross-sectional view showing a cross-section taken along the line II-II' of FIG. 4. The example illustrated is a memory cell array having a 4-layer structure configured from cell array layers MA0 to MA3. A word line WL0j is shared by memory cells MC0 and MC1 below and above the word line WL0j, a bit line BL1i is shared by memory cells MC1 and MC2 below and above the bit line BL1i, and a word line WL1j is shared by memory cells MC2 and MC3 below and above the word line WL1j.

Moreover, it is also possible to adopt a configuration interposing an interlayer insulating film between cell array layers in the manner of line/cell/line/interlayer-insulating-layer/line/cell/line, instead of this repetition of line/cell/line/cell. Note that the memory cell array 1 may also be divided into MATs configured from several memory cell groups. The previously described column control circuit 2 and row control circuit 3 may be provided to each MAT, each sector, or each cell array layer MA, or may be shared by these. Moreover, these control circuits may also be shared by a plurality of bit lines BL for reduction of area.

[Data Storage States]

Figure 6:
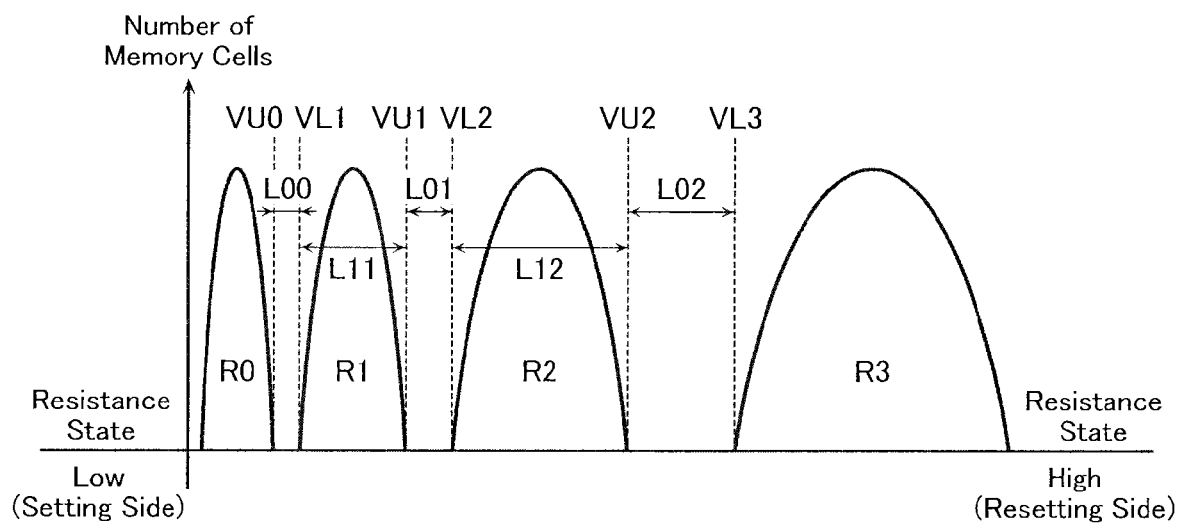
FIG. 6 is an example of a view explaining resistance value distributions of data stored in a nonvolatile semiconductor memory device according to a first embodiment.

Next, data storage states of the nonvolatile semiconductor memory device of the present embodiment will be described with reference to FIG. 6. FIG. 6 is a view explaining resistance value distributions of data stored in the nonvolatile semiconductor memory device according to the present embodiment.

In the present embodiment, the memory cell MC of the nonvolatile semiconductor memory device stores 4-level data based on a resistance value. In this case, the resistance value distributions corresponding to the data are as shown in FIG. 6. The memory cell MC has set therein, sequentially, from a low-resistance side, resistance value distributions of R0 level, R1 level, R2 level, and R3 level. Moreover, respectively allotted to these resistance value distributions R0, R1, R2, and R3 are data "11", "01", "10", and "00". Note that it can be arbitrarily selected which data is allotted to which resistance value distribution.

In the description of the embodiments below, in figures showing the resistance value distributions, a side where a resistance state is low is sometimes called a low-resistance state (Low (Setting Side)) and a side where a resistance state is high is sometimes called a high-resistance state (High (Resetting Side)). Moreover, an operation that raises the resistance value of the memory cell MC to shift the resistance value of the memory cell MC to a resistance value distribution on the high-resistance state is sometimes called a reset operation, and an operation that lowers the resistance value of the memory cell MC to shift the resistance value of the memory cell MC to a resistance value distribution on the low-resistance state is sometimes called a set operation.

The set operation of so-called bipolar type is performed by applying a setting voltage of a first polarity to the variable resistance element VR. This causes the variable resistance element to change from a high-resistance state to a low-resistance state. On the other hand, the reset operation is performed by applying to the variable resistance element in a low-resistance state after the set operation a resetting voltage of a second polarity opposite to the first polarity in the set operation. This causes the variable resistance element VR to change from a low-resistance state to a high-resistance state. Moreover, in a resistance varying memory of unipolar type, polarities of the setting voltage and the resetting voltage are the same, and an application time or voltage value of the setting voltage and resetting voltage are set to different values. The nonvolatile semiconductor memory device of the present embodiment may be applied to either of a bipolar type or a unipolar type.

In order to control the resistance value of the memory cell MC to be included in the resistance value distributions R0, R1, R2, and R3, the resistance value distributions R0, R1, R2, and R3 are provided with resistance values VU0, VL1, VU1, VL2, VU2, and VL3 as verify levels. The resistance value VU0 is a value corresponding to an upper limit of the resistance value distribution R0. The resistance values VL1 and VU1 are values corresponding respectively to a lower limit and an upper limit of the resistance value distribution R1. The resistance values VL2 and VU2 are values corresponding respectively to a lower limit and an upper limit of the resistance value distribution R2. The resistance value VL3 is a value corresponding to a lower limit of the resistance value distribution R3.

In the present embodiment, each of the resistance values VU0, VL1, VU1, VL2, VU2, and VL3 is set as follows. Each of the resistance values VU0, VL1, VU1, VL2, VU2, and VL3 is set such that a width of the resistance value distributions R0, R1, R2, and R3 are made larger as a value of the resistance value of the resistance value distributions R0, R1, R2, and R3 becomes larger. As shown in FIG. 6, a width L12 of the resistance value distribution R2 is larger than a width L11 of the resistance value distribution R1 positioned on the low-resistance state (L12>L11). In this way, each of the resistance values VU0, VL1, VU1, VL2, VU2, and VL3 is set such that the width of the resistance value distributions R0, R1, R2, and R3 becomes larger as they are closer to the high-resistance state.

In addition, each of the resistance values VU0, VL1, VU1, VL2, VU2, and VL3 is set such that a distance between the resistance value distributions R0, R1, R2, and R3 are made larger as the value of the resistance value of the resistance value distributions R0, R1, R2, and R3 becomes larger. As shown in FIG. 6, a distance L01 between the resistance value distribution R1 and the resistance value distribution R2 is larger than a distance L00 between the resistance value distribution R0 and the resistance value distribution R1 positioned on the low-resistance state (L01>L00). Moreover, a distance L02 between the resistance value distribution R2 and the resistance value distribution R3 is larger than the distance L01 between the resistance value distribution R1 and the resistance value distribution R2 positioned on the low-resistance state (L02>L01). In this way, each of the resistance values VU0, VL1, VU1, VL2, VU2, and VL3 is set such that the distance between the resistance value distributions R0, R1, R2, and R3 becomes larger as they are closer to the high-resistance state.

Note that it is possible that the resistance value distribution R0 having the lowest resistance value is only provided with the resistance value VU0, without having a lower limit resistance value provided thereto. Moreover, it is possible that the resistance value distribution R3 having the highest resistance value is only provided with the resistance value VL3, without having an upper limit resistance value provided thereto. In addition, the horizontal axis expressing a resistance state in FIG. 6 may be an ordinary natural number axis or may be a logarithmic axis. In the case of a logarithmic axis, the resistance value distribution of the memory cell MC becomes a logarithmic distribution having the resistance value distribution logarithmically converted. The above-described setting of each of the resistance values VU0, VL1, VU1, VL2, VU2, and VL3 is determined based on a logarithmic distribution. Moreover, in order to set each of the resistance values VU0, VL1, VU1, VL2, VU2, and VL3 as described above, there need only be at least three resistance value distributions.

[Write Operation]

Figure 7:
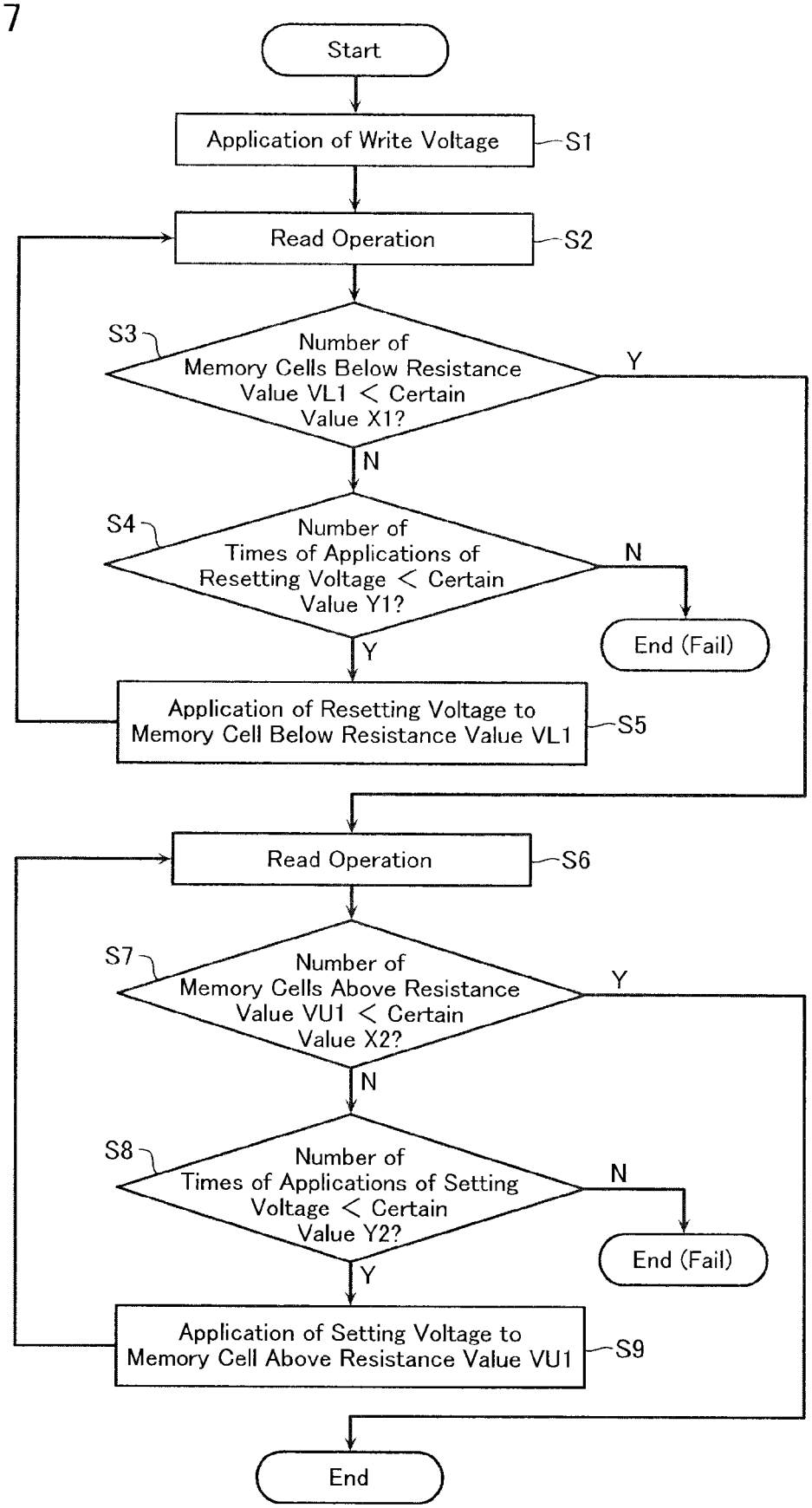
FIG. 7 is an example of a flowchart explaining a data write operation of the nonvolatile semiconductor memory device according to the first embodiment.

Next, an operation that writes data to the memory cell MC by changing the resistance state of the memory cell MC will be described with reference to FIG. 7. FIG. 7 is a flowchart explaining a data write operation of the nonvolatile semiconductor memory device according to the present embodiment. Described in the example shown in FIG. 7 is an example where a data write operation is executed such that the memory cell MC is included in the resistance value distribution R1. However, the same applies also in the case where a data write operation is executed such that the memory cell MC is included in another resistance value distribution. Note that this write operation is described taking as an example an operation that writes data simultaneously to a plurality of memory cells (for example, 1024 memory cells). However, the present operation may be applied even when writing to a single memory cell.

When the operation is started, first, a write voltage is applied to the memory cell MC (step S1). This write voltage application operation may be the reset operation that raises the resistance value of the memory cell MC to shift the resistance value of the memory cell MC to a resistance value distribution on the high-resistance state, or may be the set operation that lowers the resistance value of the memory cell MC to shift the resistance value of the memory cell MC to a resistance value distribution on the low-resistance state. In order to shift the memory cell MC from the resistance value distribution R0 to the target resistance value distribution R1, the memory cell MC is applied with the resetting voltage, and in order to shift the memory cell MC from the resistance value distributions R2 and R3 to the target resistance value distribution R1, the memory cell MC is applied with the setting voltage.

Next, a read operation is executed to the memory cell MC that has been applied with the write voltage (step S2). This read operation is an operation that reads whether the resistance value of the memory cell MC which is a target of the write operation is less than the resistance value VL1 which is the lower limit of the resistance value distribution R1 or not.

Next, it is determined whether the number of memory cells MC having a resistance value less than the resistance value VL1 is less than a certain value X1 or not (step S3). The certain value X1 is determined in view of data capable of being rescued by ECC (Error Check and Correction). In step S3, if the number of memory cells MC having a resistance value less than the resistance value VL1 is the certain value X1 or more, then the operation shifts to step S4, and if the number of memory cells MC having a resistance value less than the resistance value VL1 is less than the certain value X1, then the operation shifts to step S6.

If the number of memory cells MC having a resistance value less than the resistance value VL1 is the certain value X1 or more, it is difficult to correct a data error by ECC. Hence, the memory cells MC of less than the resistance value VL1 are applied with the resetting voltage to be shifted to the high-resistance state. In step S4, it is determined whether the number of times of applications of this resetting voltage is less than a certain value Y1 or not. The certain value Y1 is determined in view of the number of times of applications permissible based on an operation time. If the number of times of applications of the resetting voltage is less than the certain value Y1, then the operation shifts to step S5. Now, in step S4, if the number of times of applications of the resetting voltage has reached the certain value Y1, then the control circuit determines a write operation failure and stops the write operation.

Next, the memory cell MC of less than the resistance value VL1 is applied with the resetting voltage (step S5). The reset operation from step S2 to step S5 is repeated until the number of times of applications of the resetting voltage has reached a specified number of times Y1 or the number of memory cells MC having a resistance value less than the resistance value VL1 falls below a specified value X1.

Next, a read operation is executed to the memory cell MC (step S6). This read operation is an operation that reads whether the resistance value of the memory cell MC which is the target of the write operation exceeds the resistance value VU1 which is the upper limit of the resistance value distribution R1 or not.

Next, it is determined whether the number of memory cells MC having a resistance value exceeding the resistance value VU1 is less than a certain value X2 or not (step S7). The certain value X2 is determined in view of data capable of being corrected by ECC. In step S7, if the number of memory cells MC having a resistance value exceeding the resistance value VU1 is the certain value X2 or more, then the operation shifts to step S8, and if the number of memory cells MC having a resistance value exceeding the resistance value VU1 is less than the certain value X2, it is determined that data write to has been performed properly and the write operation is finished.

If the number of memory cells MC having a resistance value exceeding the resistance value VU1 is the certain value X2 or more, it is difficult to correct a data error by ECC. Hence, the memory cells MC exceeding the resistance value VU1 are applied with the setting voltage to be shifted to the low-resistance state. In step S8, it is determined whether the number of times of applications of this setting voltage is less than a certain value Y2 or not. The certain value Y2 is determined in view of the number of times of applications permissible based on an operation time. If the number of times of applications of the setting voltage is less than the certain value Y2, then the operation shifts to step S9. Now, in step S8, if the number of times of applications of the setting voltage has reached the certain value Y2, then the control circuit determines a write operation failure and stops the write operation.

Next, the memory cell MC exceeding the resistance value VU1 is applied with the setting voltage (step S9). The set operation from step S6 to step S9 is repeated until the number of times of applications of the setting voltage has reached a specified number of times Y2 or the number of memory cells MC having a resistance value exceeding the resistance value VU1 falls below a specified value X2.

As described above, if the number of memory cells MC having a resistance value less than the resistance value VL1 is less than the certain value X1 and the number of memory cells MC exceeding the resistance value VU1 is less than the certain value X2, it is considered as data write has been performed properly and the write operation finishes. Moreover, in step S4 and step S8, if the numbers of times of applications of the resetting voltage and the setting voltage have reached the specific numbers of times Y1 and Y2, then the control circuit determines a write operation failure and stops the write operation.

Note that the reset operation from step S2 to step S5 and the set operation from step S6 to step S9 may be interchanged.

Figure 8:
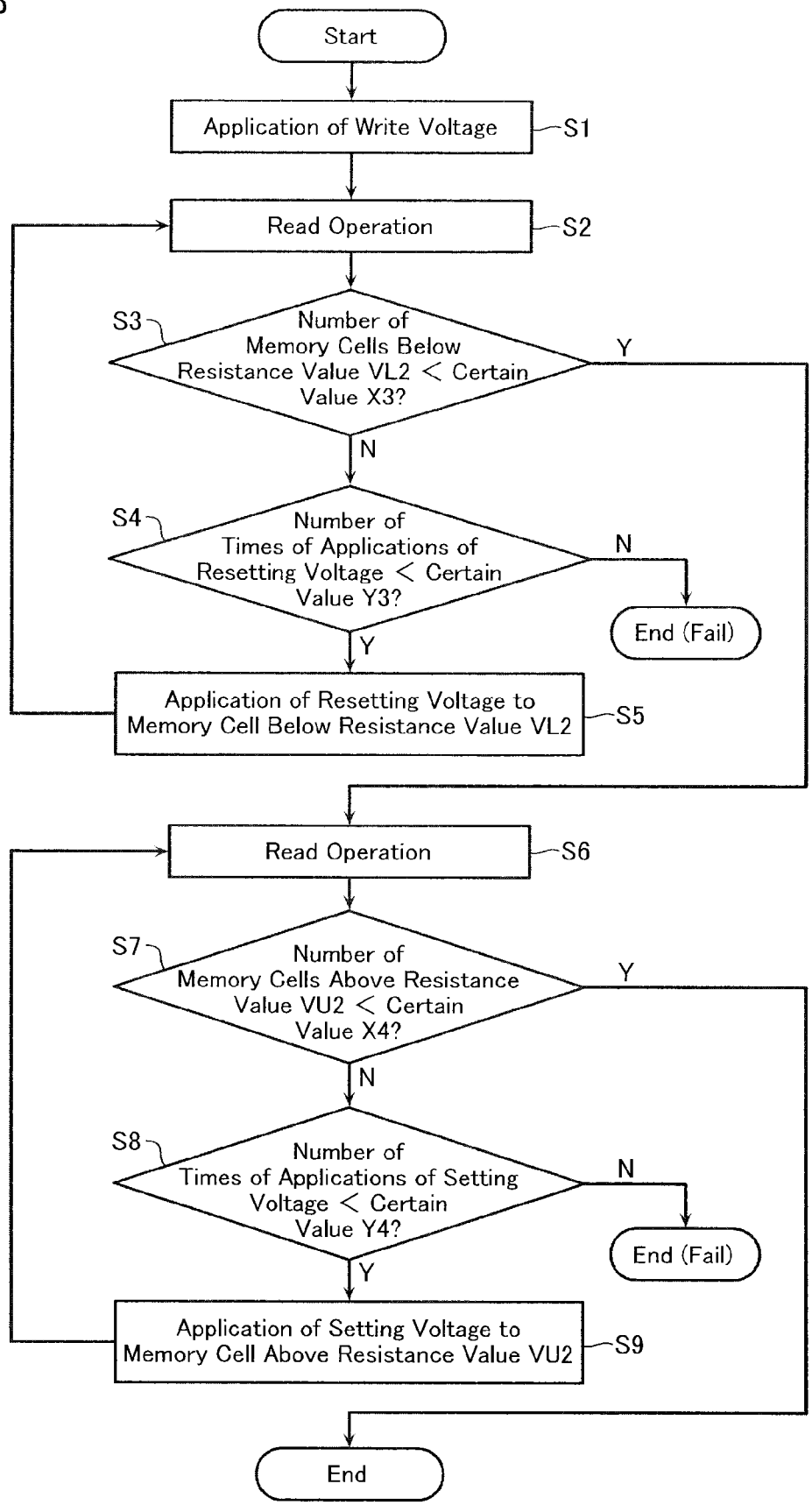
FIG. 8 is an example of a flowchart explaining the data write operation of the nonvolatile semiconductor memory device according to the first embodiment.
Figure 9:
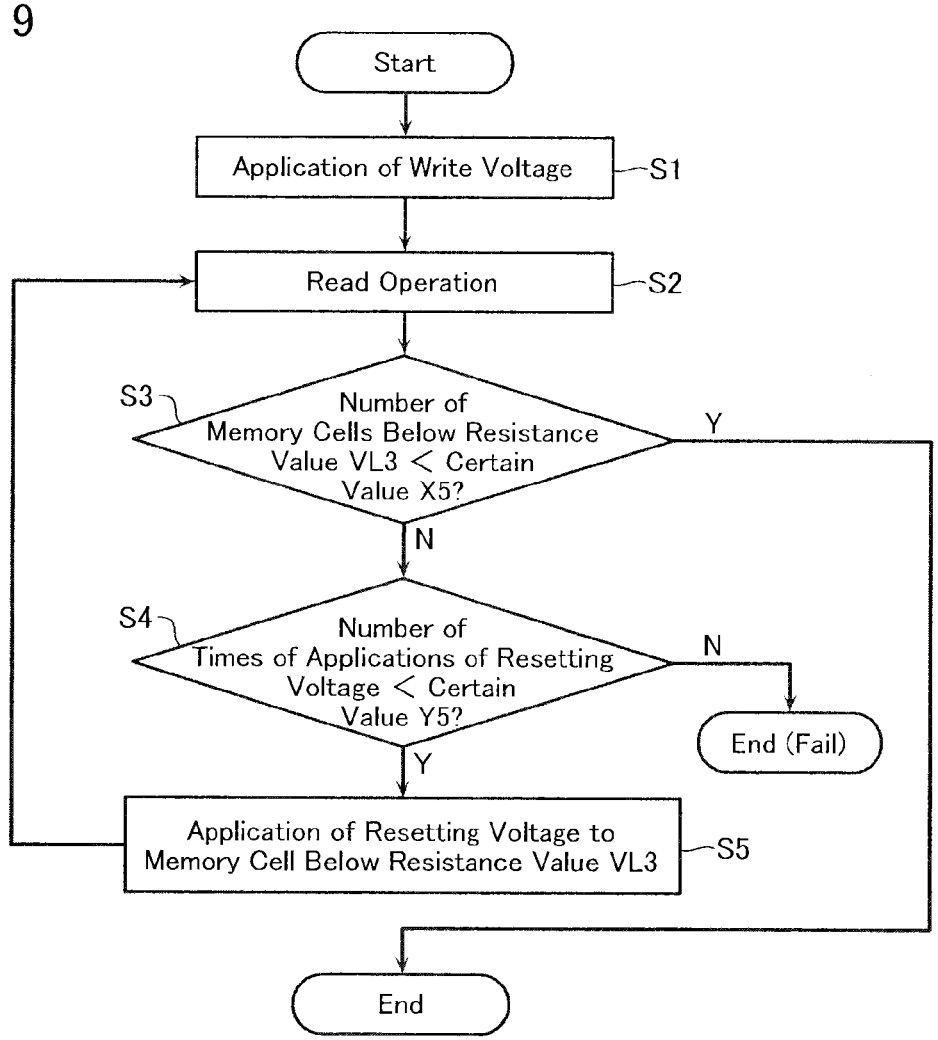
FIG. 9 is an example of a flowchart explaining the data write operation of the nonvolatile semiconductor memory device according to the first embodiment.

Described in the example shown in FIG. 7 is an example where the data write operation is executed such that the memory cell MC is included in the resistance value distribution R1. A data write operation such that the memory cell MC is included in another resistance value distribution (for example, resistance value distributions R2 and R3) may also be executed by a similar operation. FIGS. 8 and 9 are flowcharts explaining the data write operation of the nonvolatile semiconductor memory device according to the present embodiment.

FIG. 8 is a view of the case where data is written such that the memory cell MC is included in the resistance value distribution R2, and FIG. 9 is a view of the case where data is written such that the memory cell MC is included in the resistance value distribution R3.

As shown in FIGS. 8 and 9, besides the fact that a resistance value which is to be a threshold is changed to correspond to the resistance value distributions R2 and R3, the examples of FIGS. 8 and 9 are similar to the example where the data write operation is executed such that the memory cell MC is included in the resistance value distribution R1 shown in FIG. 7. However, in the case where data is written such that the memory cell MC is included in the resistance value distribution R3, there is no need to set an upper limit of the resistance value, hence steps from step S6 to step S9 are omitted. In this way, the data write operation is performed resulting in resistance value distributions of the kind shown in FIG. 6.

[Advantages]

Figure 10:
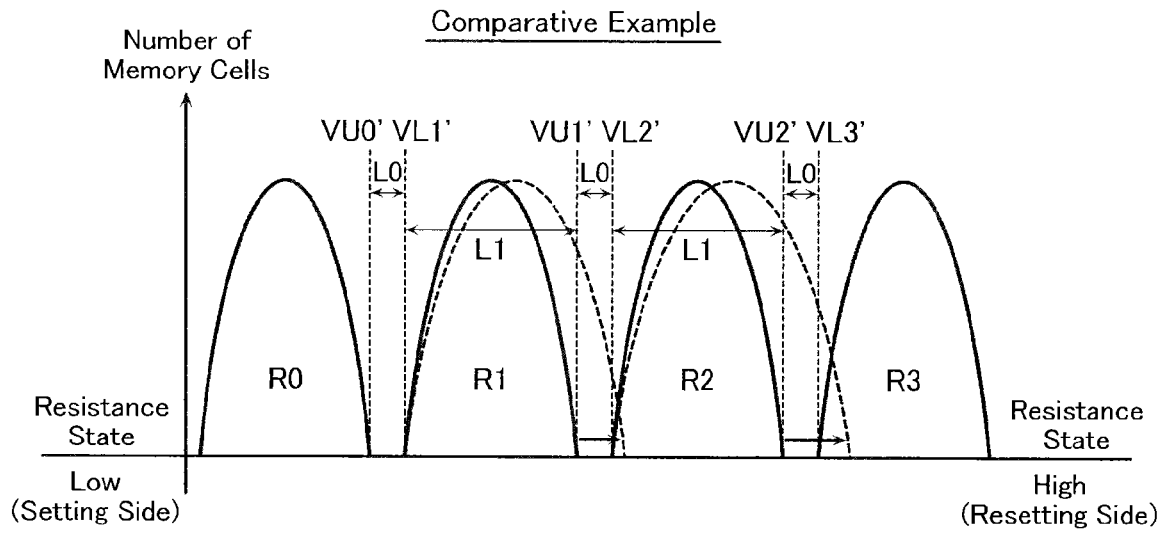
FIG. 10 is an example of a view explaining resistance value distributions of data stored in a nonvolatile semiconductor memory device according to a comparative example.

Next, advantages of the nonvolatile semiconductor memory device according to the present embodiment will be described with reference to a comparative example. FIG. 10 is a view explaining resistance value distributions of data stored in a nonvolatile semiconductor memory device according to the Comparative Example.

In the comparative example too, in order to control the resistance value of the memory cell MC to be included in the resistance value distributions R0, R1, R2, and R3, the resistance value distributions R0, R1, R2, and R3 are provided with resistance values VU0', VL1', VU1', VL2', VU2', and VL3'as verify levels from the Low (Setting Side) to the High (Resetting Side. The resistance value VU0' is a value corresponding to an upper limit of the resistance value distribution R0. The resistance values VL1' and VU1' are values corresponding respectively to a lower limit and an upper limit of the resistance value distribution R1. The resistance values VL2' and VU2' are values corresponding respectively to a lower limit and an upper limit of the resistance value distribution R2. The resistance value VL3' is a value corresponding to a lower limit of the resistance value distribution R3.

In the comparative example, each of the resistance values VU0', VL1', VU1', VL2', VU2', and VL3' is set as follows. Each of the resistance values VU0', VL1', VU1', VL2', VU2', and VL3' is set such that a width of the resistance value distributions R0, R1, R2, and R3 is identical. As shown in FIG. 10, a width L1 of the resistance value distributions R1 and R2 is identical.

In addition, each of the resistance values VU0', VL1', VU1', VL2', VU2', and VL3' is set such that a distance between the resistance value distributions R0, R1, R2, and R3 is identical. As shown in FIG. 10, a distance L0 between the resistance value distribution R0 and the resistance value distribution R1, a distance L0 between the resistance value distribution R1 and the resistance value distribution R2, and a distance L0 between the resistance value distribution R2 and the resistance value distribution R3 are identical.

Now, in the read operation of the resistance varying memory, read noise caused by trapping/de-trapping of electrons in/from the variable resistance element VR is sometimes present. The higher the resistance state is, the more strongly the resistance state is affected by read noise. Hence, the higher the resistance state is, the higher a possibility of data failure is. Therefore, when multi-level data is stored in the memory cell MC, the higher a resistance state distribution is, the higher the possibility of read error increases. FIG. 10 shows an example where, due to read noise, memory cells deviate from upper edges of the resistance value distributions R1 and R2. Note that the deviation of the memory cell MC from the resistance value distribution due to read noise may also occur on a lower edge side. For convenient, this description is omitted from FIG. 10. When such memory cells are present, read error occurs and reliability of data is degraded.

In contrast, as shown in FIG. 6, in the above-described embodiment, each of the resistance values VU0, VL1, VU1, VL2, VU2, and VL3 is set such that the width of the resistance value distributions R0, R1, R2, and R3 are made larger as the resistance value of the resistance value distributions R0, R1, R2, and R3 becomes larger. In addition, each of the resistance values VU0, VL1, VU1, VL2, VU2, and VL3 is set such that the distance between the resistance value distributions is made larger as the resistance value of the resistance value distributions R0, R1, R2, and R3 becomes larger.

By setting such that the width of the resistance value distribution is made larger as the resistance value of the distributions R0, R1, R2, and R3 becomes larger, the possibility that a memory cell MC is included in a resistance value distribution increases when a memory cell MC is a high-resistance state. As a result, in the read operation during the write operation, the possibility that a memory cell is included in a resistance value distribution increases and it is possible to reduce the risk of a misread occurring, even if read noise occurs. As a result, precision of the write operation to the high-resistance state resistance value distribution can be improved, and slowing of operation speed can be suppressed.

In addition, the distance between the resistance value distributions R0, R1, R2, and R3 is set to be larger as the value of the resistance value of the resistance value distributions R0, R1, R2, and R3 becomes larger. Due to this, even if read noise causes a memory cell deviation from a resistance value distribution, the possibility of misread as a memory cell present in a different resistance value distribution can be lowered. As a result, reliability of data stored in the memory cell MC can be improved.

Moreover, in a data write operation in a semiconductor memory device employing a resistance varying element, there is no need to cause the resistance varying element to undergo transition to a high-resistance state after setting the resistance varying element to a low-resistance state. That is, in the present embodiment, there is no need for an operation similar to an erase operation in a nonvolatile semiconductor memory device of the kind that changes a threshold voltage by a charge accumulation state. Accordingly, the write operation can be executed regardless of data stored by the memory cell before the write operation.

[Second Embodiment]

Next, a second embodiment of the present invention will be described with reference to FIG. 11. An overall configuration of a nonvolatile semiconductor memory device of the second embodiment is similar to that of the first embodiment, hence a detailed description thereof will be omitted. Moreover, components having a similar configuration to those in the first embodiment are assigned with identical reference symbols to those of the first embodiment, and a duplicated description of such places will be omitted. The above first embodiment described an example where the width of the resistance value distribution or the distance between resistance value distributions changes as the resistance value becomes larger. The present embodiment differs from the first embodiment in that in the present embodiment, a difference between read resistance values for reading data of the memory cell MC changes as the resistance value becomes larger.

[Data Storage States]

Data storage states of the nonvolatile semiconductor memory device of the present embodiment will be described with reference to FIG. 11. FIG. 11 is a view explaining resistance value distributions of data stored in the nonvolatile semiconductor memory device according to the present embodiment.

In the present embodiment too, the memory cell MC of the nonvolatile semiconductor memory device stores 4-level data based on a resistance value. In this case, the resistance value distributions corresponding to the data are as shown in FIG. 11. The memory cell MC has set therein, sequentially, from a low-resistance side (Low (Setting Side)), resistance value distributions of R0 level, R1 level, R2 level, and R3 level (to High (Resetting Side)).

Figure 11:
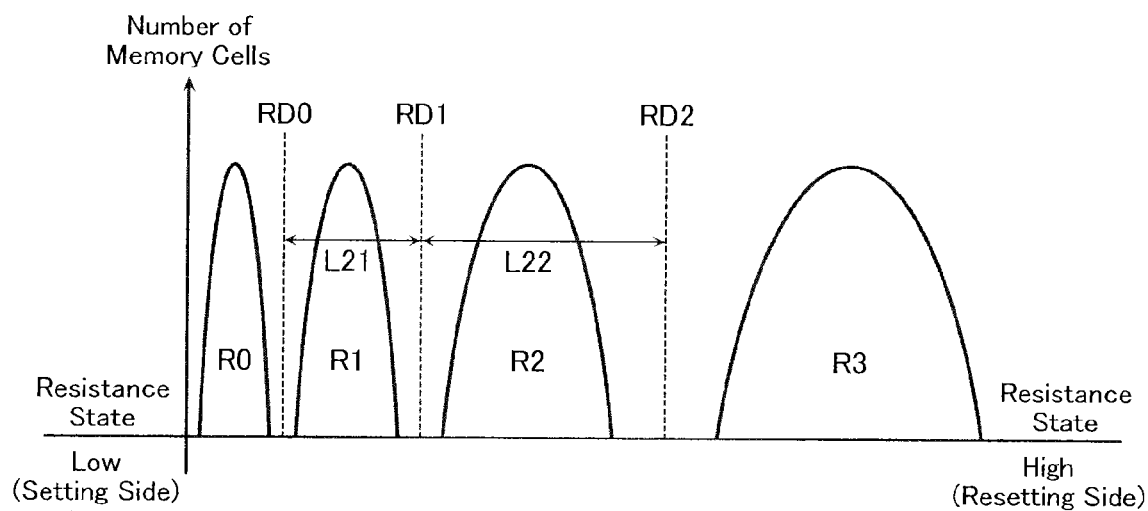
FIG. 11 is an example of a view explaining resistance value distributions of data stored in a nonvolatile semiconductor memory device according to a second embodiment.

Note that although omitted from FIG. 11, the present embodiment too is set such that the width of the resistance value distribution is made larger as the resistance value of the distributions R0, R1, R2, and R3 becomes larger, and is set such that the distance between the resistance value distributions R0, R1, R2, and R3 is made larger as the resistance value of the distributions R0, R1, R2, and R3 becomes larger.

In the present embodiment, in order to read which of the resistance value distributions R0, R1, R2, and R3 the memory cell MC is included in, the resistance value distributions R0, R1, R2, and R3 are provided with read resistance values RD0, RD1, and RD2. The read resistance value RD0 is set between the distributions R0 and R1. The read resistance value RD1 is set between the distributions R1 and R2. The read resistance value RD2 is set between the distributions R2 and R3.

In the present embodiment, each of the read resistance values RD0, RD1, and RD2 is set as follows. Each of the read resistance values RD0, RD1, and RD2 is set such that the difference between the read resistance values is made larger as the resistance value becomes larger. As shown in FIG. 11, a difference L22 between the read resistance value RD1 and the read resistance value RD2 is larger than a difference L21 between the read resistance value RD0 and the read resistance value RD1 (L22>L21). In this way, each of the read resistance values RD0, RD1, and RD2 is set such that the difference between the read resistance values becomes larger as they are closer to the high-resistance state.

Note that in order for each of the read resistance values RD0, RD1, and RD2 to be set such that the difference between the read resistance values becomes larger as they are closer to the high-resistance state, at least four resistance value distributions must be formed. This is because unless the number of the read resistance values set between the resistance value distributions is three or more, a comparison of the difference between the read resistance values cannot be made.

[Data Read Operation]

Note that the data read operation can be executed by measuring how much current flows in the memory cell when each of the memory cells MC is applied with a certain read voltage. Based on this current, it is determined whether the resistance value of the variable resistance element VR in the memory cell MC exceeds the read resistance values RD0, RD1, and RD2 or not, whereby it is determined which of the resistance value distributions R0, R1, R2, and R3 the memory cell MC is included in. This enables data stored in the memory cell MC to be read.

[Advantages]

As described in the first embodiment, the higher the resistance state of the memory cell MC becomes, the higher the possibility of a misread due to read noise is.

In contrast, as shown in FIG. 11, the nonvolatile semiconductor memory device of the present embodiment has each of the read resistance values RD0, RD1, and RD2 set such that the difference between the read resistance values is made larger as the resistance value becomes larger. The difference between the read resistance values is set to be larger as the value of the resistance value becomes larger. Due to this, even if read noise causes a memory cell deviation from a resistance value distribution, the possibility of misread as a memory cell present in a different resistance value distribution can be lowered. As a result, reliability of data stored in the memory cell MC can be improved.

[Other]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Figure 12:
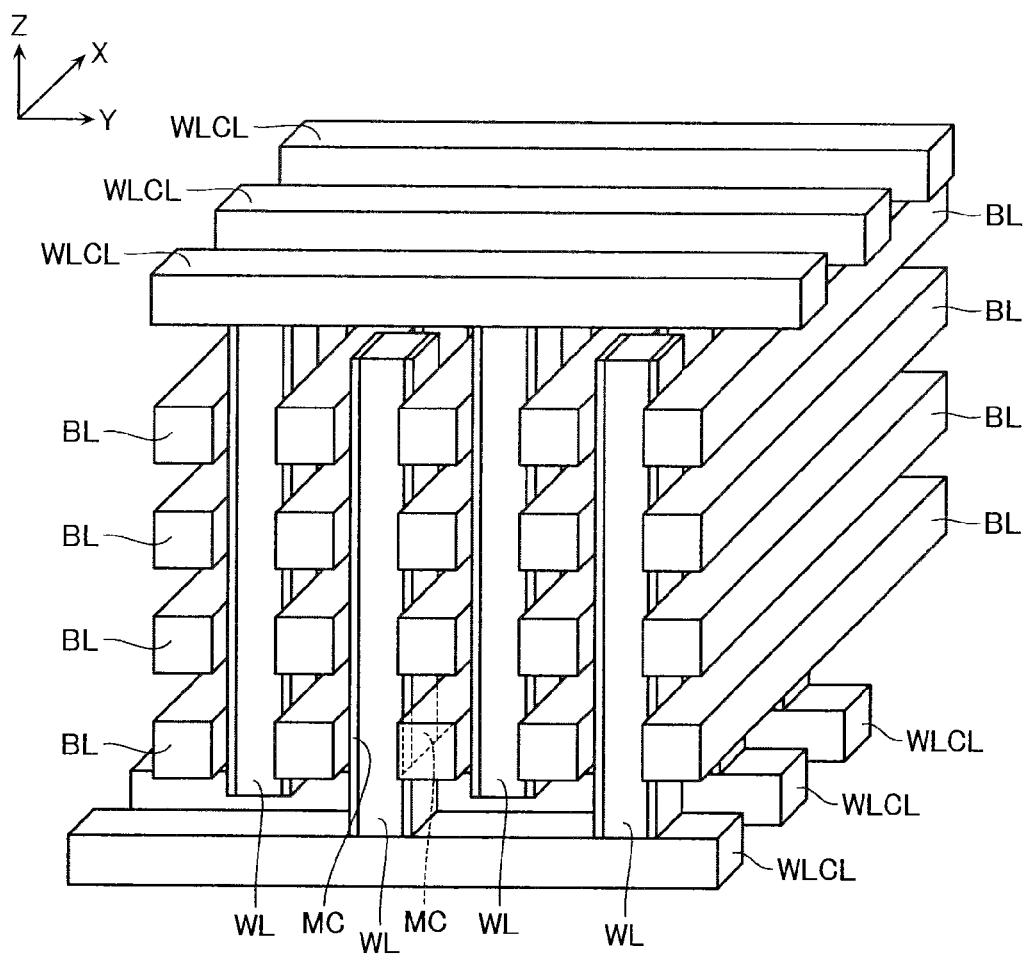
FIG. 12 is an example of a perspective view showing another example of configuration of the memory cell array 1.

For example, it is also possible for the memory cell array to be configured three-dimensionally using a variable resistance element having a current rectifying function. FIG. 12 is a perspective view showing part of a memory cell array 1. The memory cell array 1 includes: bit lines BL extending in an X direction in a Y-Z plane and arranged with a certain pitch in a Z direction; columnar word lines WL extending in the Z direction in an X-Y plane and arranged with a certain pitch in the X direction; and a memory cell MC provided at intersections of bit lines BL and word lines WL. Note that the word lines WL and the bits line BL are shared by two memory cells MC adjacent in a Y direction. In addition, the word lines WL are commonly connected to word line connection lines WLCL extending in the Y direction in the X-Y plane and arranged with a certain pitch in the X direction. By configuring a memory block three-dimensionally in this way, optimization of chip area can be achieved.

Moreover, the above-described embodiments described an example where the number of resistance value distributions included in the memory cell MC is four, but the present invention is not limited to this configuration. For example, the number of resistance value distributions need only be a plurality of three or more, and data stored in the memory cell can be set to multi-level data of three levels or more based on performance of the variable resistance element VR.

What is claimed is:

1. A nonvolatile semiconductor memory device, comprising:
   a memory cell disposed between a first line and a second line and including a variable resistance element; and
   a control circuit configured to cause data of 2 bits or more to be stored in the memory cell by setting the memory cell to be included in one of resistance value distributions, and to apply a voltage to the memory cell in a write operation,
   the control circuit being configured to set a first resistance value distribution and a second resistance value distribution, the second resistance value distribution having a resistance value larger than that of the first resistance value distribution, and to set a second width to be larger than a first width, the second width being a width between a second upper limit value as an upper limit value of the second resistance value distribution and a second lower limit value as a lower limit value of the second resistance value distribution, and the first width being a width between a first upper limit value as an upper limit value of the first resistance value distribution and a first lower limit value as a lower limit value of the first resistance value distribution.

2. The nonvolatile semiconductor memory device according to claim 1, wherein
   the control circuit s configured to set a third resistance value distribution which has a resistance value larger than that of the second resistance value distribution, and to set a width between the first upper limit value of the first resistance value distribution and the second lower limit value of the second resistance value distribution to be smaller than a width between the second upper limit value of the second resistance value distribution and a third lower limit value as a lower limit value of the third resistance value distribution.

3. The nonvolatile semiconductor memory device according to claim 2, wherein
   the control circuit is configured to perform a read operation that determines whether a resistance value of the memory cell is lamer than a certain read resistance value between the resistance value distributions or not, and
   when a first read resistance value is set between the first resistance value distribution and the second resistance value distribution, a second read resistance value is set between the second resistance value distribution and the third resistance value distribution, and a third read resistance value is set to be larger than a third upper limit value as an upper limit value of the third resistance value distribution,
   the control circuit is configured to set such that a width between the first read resistance value and the second read resistance value is made smaller than a width between the second read resistance value and the third read resistance value.

4. The nonvolatile semiconductor memory device according to claim 1, wherein
   the control circuit is configured to logarithmically convert the resistance value distributions to determine the width of the resistance value distributions.

5. The nonvolatile semiconductor memory device according to claim 1,
   further comprising a third line,
   the first line, the second line, and third line being stacked above a substrate,
   one memory cell is provided between the first line and the second line, and another memory cell is provided between the second line and the third line.

6. The nonvolatile semiconductor memory device according to claim 1, wherein
   a plurality of the first lines extend in a direction parallel to a main surface of the substrate, the second lines extend in a direction perpendicular to the substrate, and the memory cells are disposed at an intersection between the first lines and the second lines.

7. The nonvolatile semiconductor memory device according to claim 1, wherein
   the control circuit is configured to set a third resistance value distribution having a resistance value larger than that of the second resistance value distribution, and a fourth resistance value distribution having a resistance value smaller than that of the first resistance value distribution.

8. The nonvolatile semiconductor memory device according to claim 1, wherein
   the first line includes a plurality of first lines that extend in a first direction,
   the second line includes a plurality of second lines that extend in a second direction, and the memory cell includes a plurality of memory cells, and the plurality of memory cells are provided at intersections of the first lines and the second lines.

9. The nonvolatile semiconductor memory device according to claim 8, wherein
in the write operation to the first resistance value distribution, when the number of first memory cells having a resistance value lower than the first lower limit value of the first resistance value distribution is a certain value or more, the control circuit is configured to perform a first operation on the first memory cell, the first operation raising the resistance value of the first memory cell, and
after the first operation, when the number of second memory cells having a resistance value higher than the first upper limit value of the first resistance value distribution is a certain value or more, the control circuit is configured to perform a second operation on the second memory cell, the second operation lowering the resistance value of the second memory cell.

10. The nonvolatile semiconductor memory device according to claim 1,
further comprising a diode connected between the first line and the second line, the diode being serially connected to the variable resistance element.

11. A nonvolatile semiconductor memory device, comprising:
a memory cell disposed between a first line and a second line and including a variable resistance element; and
a control circuit configured to cause data of 2 bits or more to be stored in the memory cell by setting the memory cell to be included in one of resistance value distributions, and to apply a voltage to the memory cell in a write operation,
the control circuit being configured to set a first resistance value distribution, a second resistance value distribution, and a third resistance value distribution, the second resistance value distribution having a resistance value larger than that of the first resistance value distribution, and the third resistance value distribution having a resistance value larger than that of the second resistance value distribution, and the control circuit being configured to perform a read operation that determines whether a resistance value of the memory cell is larger than a certain read resistance value between the resistance value distributions or not, and
when a first read resistance value is set between the first resistance value distribution and the second resistance value distribution, a second read resistance value is set between the second resistance value distribution and the third resistance value distribution, and a third read resistance value is set to be larger than a third upper limit value as an upper value of the third resistance value distribution,
the control circuit is configured to set such that a width between the first read resistance value and the second read resistance value is made smaller than a width between the second read resistance value and the third read resistance value.

12. The nonvolatile semiconductor memory device according to claim 11, wherein
the control circuit is configured to set such that a second width is larger than a first width, the second width being a width between a second upper limit value as an upper limit value of the second resistance value distribution and a second lower limit value as a lower limit value of the second resistance value distribution, and the first width being a width between a first upper limit value as an upper limit value of the first resistance value distribution and a first lower limit value as a lower limit value of the first resistance value distribution.

13. The nonvolatile semiconductor memory device according to claim 12, wherein
the control circuit is configured to set such that a width between the first upper limit value of the first resistance value distribution and the second lower limit value of the second resistance value distribution is made smaller than a width between the second upper limit value of the second resistance value distribution and a third lower limit value which is a lower limit value of the third resistance value distribution.

14. The nonvolatile semiconductor memory device according to claim 11, wherein
the control circuit is configured to logarithmically convert the resistance value distributions to determine the width of the resistance value distributions.

15. The nonvolatile semiconductor memory device according to claim 11,
further comprising a third line,
the first line the second line, and third line being stacked above a substrate,
one memory cell is provided between the first line and the second line, and another memory cell is provided between the second line and the third line.

16. The nonvolatile semiconductor memory device according to claim 11, wherein
a plurality of the first lines extend in a direction parallel to a main surface of the substrate, the second lines extend in a direction perpendicular to the substrate, and the memory cells are disposed at an intersection between the first lines and the second lines.

17. The nonvolatile semiconductor memory device according to claim 11, wherein
the first line includes a plurality of first lines that extend in a first direction,
the second line includes a plurality of second lines that extend in a second direction, and
the memory cell includes a plurality of memory cells and the plurality of memory cells are provided at intersections of the first lines and the second lines.

* * * * *